(12) United States Patent
Li et al.

(10) Patent No.: US 9,817,313 B2
(45) Date of Patent: Nov. 14, 2017

(54) LAMINATED STRUCTURE

(71) Applicant: Eternal Materials Co., Ltd., Kaohsiung (TW)

(72) Inventors: Shin Yi Li, Kaohsiung (TW); Jen Yu Liu, Kaohsiung (TW)

(73) Assignee: Eternal Materials Co., Ltd. (TW)

( * ) Notice: Subject to any disclaimer, the term of this patent is extended or adjusted under 35 U.S.C. 154(b) by 0 days.

(21) Appl. No.: 15/086,412

(22) Filed: Mar. 31, 2016

(65) Prior Publication Data
US 2016/0291471 A1 Oct. 6, 2016

(30) Foreign Application Priority Data
Mar. 31, 2015 (TW) .............................. 104110527 A

(51) Int. Cl.
*G03F 7/09* (2006.01)
*B32B 27/08* (2006.01)
(Continued)

(52) U.S. Cl.
CPC ............... *G03F 7/092* (2013.01); *B32B 7/12* (2013.01); *B32B 27/08* (2013.01); *B32B 27/32* (2013.01); *B32B 27/36* (2013.01); *C09J 7/0296* (2013.01); *G02F 1/133305* (2013.01); *G03F 7/027* (2013.01); *G03F 7/033* (2013.01); *G03F 7/093* (2013.01); *G03F 7/11* (2013.01); *H01L 51/5253* (2013.01); *H05K 3/285* (2013.01); *H05K 3/287* (2013.01); *B32B 2307/20* (2013.01); *B32B 2307/202* (2013.01); *B32B 2307/21* (2013.01);
(Continued)

(58) Field of Classification Search
CPC ... G03F 7/033; G03F 7/09; G03F 7/11; H01L 51/5253; G02F 1/133305; H05K 3/285; H05K 3/287; C09J 7/0296; B32B 27/36; B32B 2457/08
USPC ....................................... 430/271.1; 428/141
See application file for complete search history.

(56) References Cited

U.S. PATENT DOCUMENTS 5,910,356 A * 6/1999 Ishikawa .................. C08J 7/047
313/461
6,037,100 A 3/2000 Yu et al.
(Continued)

FOREIGN PATENT DOCUMENTS

CN          1806000 A      7/2006
CN        103476863 A     12/2013
(Continued)

OTHER PUBLICATIONS

Machine Translation of CN103476863 (no date).*
(Continued)

*Primary Examiner* — Amanda C. Walke
(74) *Attorney, Agent, or Firm* — Drinker Biddle & Reath LLP

(57) ABSTRACT

A laminated structure for use as a thy film photoresist, which includes a supporting layer, a photosensitive resin layer and a protective layer. The protective layer is a polyester film that has a maximum surface roughness between 1,500 nm and 2,500 nm, and a sheet resistance between $1\times10^8\Omega/\square$ and $1\times10^{12}\Omega/\square$. The laminated structure is particularly applicable to the manufacture of a photosensitive device and a circuit of a printed circuit board or a lead frame.

7 Claims, 1 Drawing Sheet

(51) Int. Cl.
*B32B 27/36* (2006.01)
*H01L 51/52* (2006.01)
*G03F 7/11* (2006.01)
*G03F 7/033* (2006.01)
*H05K 3/28* (2006.01)
*G02F 1/1333* (2006.01)
*C09J 7/02* (2006.01)
*G03F 7/027* (2006.01)
*B32B 7/12* (2006.01)
*B32B 27/32* (2006.01)

(52) U.S. Cl.
CPC ..... *B32B 2307/40* (2013.01); *B32B 2307/538* (2013.01); *B32B 2307/732* (2013.01); *B32B 2457/08* (2013.01)

(56) References Cited

U.S. PATENT DOCUMENTS

| | | | | |
|---|---|---|---|---|
| 6,468,716 | B1* | 10/2002 | Sugie | G03F 7/11 428/40.5 |
| 6,998,175 | B2* | 2/2006 | Murata | C09J 7/0246 428/343 |
| 7,662,540 | B2* | 2/2010 | Takashima | G03F 7/0007 430/270.1 |
| 7,687,224 | B2* | 3/2010 | Kimura | G03F 7/092 430/270.1 |
| 7,736,834 | B2* | 6/2010 | Miyasaka | G03F 7/027 430/270.1 |
| 2001/0051257 | A1* | 12/2001 | Kobayashi | B29C 55/023 428/216 |
| 2006/0210768 | A1* | 9/2006 | Masuda | B29C 33/68 428/141 |
| 2007/0269738 | A1* | 11/2007 | Itagaki | G03F 7/095 430/270.1 |
| 2010/0063234 | A1* | 3/2010 | Nakai | B29C 55/143 526/321 |
| 2011/0065046 | A1* | 3/2011 | Tanaka | G03F 7/027 430/281.1 |
| 2012/0315465 | A1* | 12/2012 | Kawasaki | G02B 27/0006 428/323 |
| 2013/0004710 | A1* | 1/2013 | Kawasaki | C09D 5/24 428/141 |

FOREIGN PATENT DOCUMENTS

| | | | |
|---|---|---|---|
| JP | 03082536 A | * | 4/1991 |
| JP | 2007009135 A | * | 1/2007 |
| TW | 531679 B | | 5/2003 |

OTHER PUBLICATIONS

Machine Translation of CN1806000 (no date).*
Taiwanese Office Action for Application No. 104110527, dated Nov. 20, 2015.
English Translation of Taiwanese Office Action for Application No. 104110527, dated Nov. 20, 2015.

* cited by examiner

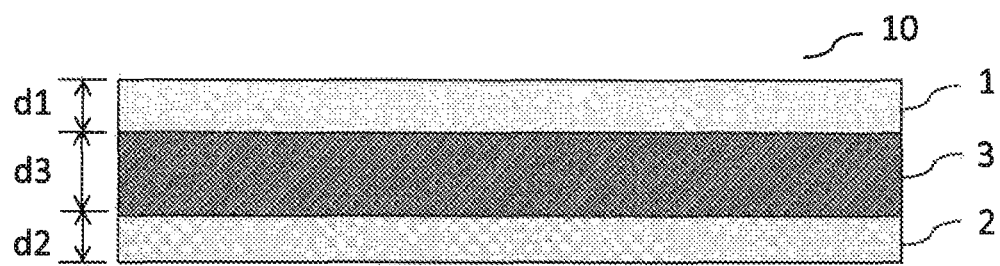

LAMINATED STRUCTURE

CROSS-REFERENCE TO RELATED APPLICATIONS

This application claims priority to Taiwanese Application No. 104110527, filed Mar. 31, 2015, which is incorporated herein by reference in its entirety.

FIELD OF THE INVENTION

The present disclosure relates to a laminated structure for use as a dry film photoresist, which is particularly applicable to the manufacturing process of a photosensitive device and a circuit of a printed circuit board or a lead frame.

BACKGROUND OF THE INVENTION

A dry film photoresist is a film made of photosensitive material that is widely used in the manufacturing process for a printed circuit board. A conventional dry film photoresist mainly includes a supporting layer, a photosensitive resin layer (namely, a photoresist layer), and a protective layer, where the supporting layer is used as a substrate supporting the photosensitive resin layer and the protective layer is used for protecting the photosensitive resin layer from being damaged during the manufacturing process. Generally, a polyester film having excellent mechanical and optical properties, heat resistance, and dimensional stability, for example, polyethylene terephthalate, is used as a supporting layer. The material, such as polyethylene, polypropylene, or polyester can be used as a protective layer.

The process of applying a dry film photoresist includes peeling off the protective layer before the application of the dry film photoresist on a printed circuit board; and laminating the exposed photosensitive resin layer on a surface of the circuit board (which is generally a copper plate). After application, the supporting layer is located above the photosensitive resin layer. Then, a desired circuit pattern is transferred to the photosensitive resin layer through exposure and development.

It is known in the art that the properties of each layer in a dry film photoresist significantly affect the quality of the photoresist and the property of circuit pattern of a printed circuit board subsequently-formed.

According to ROC (TW) Patent No. 531679, it was found that, although a conventional polyethylene protective layer has flexibility, chemical resistance and good peeling property, gels with a high molecular weight may be generated during polymerization of polyethylene. Such gels may give rise to micro-protrusions (namely, a fish eye) on the polymerized polyethylene film. Due to the presence of such fish eyes, when the photosensitive resin layer is laminated onto a circuit board after the removal of the protective layer, air may enter the interface where the circuit board is laminated to the photosensitive resin layer, and form air holes. Such air holes lead to defects, such as short-circuit, in a circuit board. In order to avoid formation of fish eyes, TW531679 adopts a polyethylene terephthalate film having the following characteristics as a protective layer: 5.0 nm≤SRa≤25 nm, 100 nm≤Spv≤250 nm and 500≤summit density≤10,000, wherein SRa is a surface roughness, Spv is a height difference from the peak to the valley, and the summit density is the number of protrusions with a height of 1 nm or above within a unit area for 4 points (2 μm×2 μm each). According to the disclosure of TW531679, when SRa, Spv and summit density increase, coarse particles form. The adhesion between the photosensitive resin layer and the protective layer increases due to the formation of such coarse particles, and thus fracture of the protective layer when being peeled off tends to occur. In contrast, when SRa, Spv and summit density decrease, the friction coefficient of the protective layer is greatly increased, and thus the problems such as formation of scratches and generation of static electricity may occur during the film process.

According to CN 180600 B, due to the strong electrostatic interaction produced when the protective layer is peeled off, foreign substance may adhere to the film and it is very likely that spark discharge may occur for the photosensitive resin coating containing an organic solvent and cause the dry film photoresist to catch fire.

In view of the foregoing problems, the present disclosure provides a laminated structure of a dry film photoresist including a protective layer having good peeling property, which reduces electrostatic interaction and improves circuit board defects and quality issues resulting from the manufacturing process of the dry film.

SUMMARY OF THE INVENTION

As mentioned above, the conventional dry film photoresist may have the disadvantages, such as worse peeling property and worse anti-static property, due to the properties of each layer, which may significantly affect the quality of the photoresist and the property of circuit pattern on a printed circuit board subsequently-formed. An objective of the present disclosure is to provide a laminated structure, which includes a supporting layer, a photosensitive resin layer and a protective layer, where the protective layer is a polyester film with surface characteristics that meet the following conditions:

$1{,}500 \text{ nm} \leq \text{maximum surface roughness} \leq 2{,}500 \text{ nm}$; and $1 \times 10^8 \, \Omega/\square \leq \text{sheet resistance} \leq 1 \times 10^{12} \, \Omega/\square$ ($\Omega/\square$ represents ohm per unit area).

The inventor of the present disclosure found through research that the maximum surface roughness and sheet resistance of a protective layer are crucial to the peeling property and antistatic property of the protective layer. Specifically, when the protective layer has certain properties or meets certain requirements (such as specific maximum surface roughness and sheet resistance), the protective layer can be easily peeled off and the electrostatic interaction generated upon peeling off the protective layer can be reduced. Furthermore, the following phenomena can be avoided: (a) the protective layer slips from the laminated structure when winding the laminated structure, and (b) wrinkles, contamination or residual air holes occur on the photosensitive resin layer when the protective layer is peeled off. Particularly, if the maximum surface roughness of the protective layer is less than 1,500 nm, slip between the protective layer and the laminated structure and wrinkles on the surface of the photosensitive resin layer may easily occur. In contrast, if the protective layer has a maximum surface roughness greater than 2,500 nm, fish eyes may form. When a protective layer meet the following conditions: 1,500 nm≤maximum surface roughness≤2,500 nm and $1 \times 10^8 \, \Omega/\square \leq$sheet resistance$\leq 1 \times 10^{12} \, \Omega/\square$, the protective layer has good peeling property so that the protective layer can be easily peeled off and no residual photosensitive resin composition is found on the protective layer.

The laminated structure of the present disclosure is particularly applicable to manufacturing of a photosensitive device and a circuit of a printed circuit board or a lead frame.

BRIEF DESCRIPTION OF THE DRAWINGS

FIG. 1 is a sectional drawing of a laminated structure according to the present disclosure.

DETAILED DESCRIPTION OF THE INVENTION

The protective layer included in the laminated structure of the present disclosure is a polyester film which has a maximum surface roughness between about 1,500 nm and about 2,500 nm, preferably between about 1,700 nm and about 2,300 nm, and more preferably between about 2,000 nm and about 2,300 nm, measured by a 3I) interferometer, and a sheet resistance between about $1 \times 10^8 \Omega/\square$ and about $1 \times 10^{12} \Omega/\square$, preferably between about $1 \times 10^9 \Omega/\square$ and about $1 \times 10^{11} \Omega/\square$, measured by a surface resistance meter (Agilent 43398). According to one specific embodiment of the present disclosure, the polyester film is a polyethylene terephthalate film. The protective layer of the present disclosure has good antistatic properties. In addition, the protective layer has a thickness between about 1 μm and about 100 μm, preferably between about 10 μm and about 40 μm. According to one specific embodiment of the present disclosure, the protective layer is preferably a surface-pretreated polyester film. For example, a coating composed of a polymer such as organopolysiloxane, fluorinated polyolefin, polyvinyl fluoride, and polyvinyl alcohol may be firstly formed on a surface of the protective layer to be laminated to the photosensitive resin layer so as to enhance the adhesion therebetween.

The supporting layer included in the laminated structure of the present disclosure is a polyester film including polyethylene terephthalate and has a thickness between about 10 μm and about 100 μm.

The photosensitive resin layer included in the laminated structure of the present disclosure may include a polymeric binder, a photopolymerizable compound containing a double bond, and a photoinitiator. Addition of a photoinitiator and a photopolymerizable compound containing a double bond give rise to the free radical polymerization of a photosensitive resin composition under ultraviolet irradiation. A photosensitive resin composition of the present disclosure may optionally include other additives, for example, a dye (such as malachite green, crystal violet or victoria blue), a stabilizing agent (such as triphenylphosphine), an adjuvant (such as benzotrizolecarboxylic acid), a color coupler, a filler, or a combination thereof.

The photopolymerizable compound containing a double bond that can be used in the present disclosure includes but is not limited to a group consisting of 1,4-butanediol di(meth)acrylate, 1,6-hexanediol di(meth)acrylate, neopentylglycol di(meth)acrylate, polyethyleneglycol di(meth)acrylate, neopentylglycol dipate di(meth)acrylate, neopentylglycol di(meth)acrylate hydroxypivalate, dicyclopentdienyl di(meth)acrylate, caprolactone modified dicyclopentdienyl di(meth)acrylate, allylated cyclohexyl di(meth)acrylate, isocyanurate di(meth)acrylate, trimethylol propane tri(meth)acrylate, dipentacrythriol tri(meth)acrylate, pentaerythritol tri(meth)acrylate, trimethyltri(meth)methacrylate, tris(acryloxyethyl) isocyanurate, dipentaerythriol penta(meth)acrylate, dipentaerythriol hexa(meth)acrylate, ethyoxyl-modified trimethylolpropane triacrylate, aliphatic urethane oligomer, and a mixture thereof.

The photoinitiator that can be used in the present disclosure includes but is not limited to benzoin, benzoin alkyl ether, benzyl, ketals, acetophenones, benzophenone, 4,4-dimethyl-amino-benzophenone, thioxanthones, morpholono-propanone, n-phenylglycine, imidazole dimer, and the like.

The purpose of adding a polymeric binder is to enhance the film forming ability of the dry film composition. The binder that can be used in the present disclosure includes polymers such as acrylic polymers, styrenic polymers, polyurethane, polycarbonate, polyester, and epoxy vinyl resin.

According to the present disclosure, the photosensitive resin layer has a thickness between about 5 μm and about 300 μm.

As shown in FIG. 1, a laminated structure (10) of the present disclosure successively includes a supporting layer (1), a photosensitive resin layer (3) and a protective layer (2). In the embodiment that the laminated structure of the present disclosure is used as a dry film photoresist, the processing steps includes but are not limited to: peeling off the protective layer first to expose the photosensitive layer, laminating the exposed photosensitive layer to a substrate by hot-pressing roller, and then removing the supporting layer on the photosensitive resin layer. After that, a desired pattern can be transferred to the photosensitive resin layer through exposure and development, followed by etching or electroplating, and after the removal of the remaining photosensitive resin layer, a substrate having a circuit pattern can be obtained.

The present disclosure will be described in terms of the following embodiments. In addition to the following embodiments, the present disclosure can be carried out in other ways without departing from the spirit of the present disclosure; the scope of the present disclosure should not be interpreted and limited solely according to the disclosure of the specification. In addition, unless otherwise stated herein, the terms "a/an," "the" and the like used in the specification (especially in the appended claims) should be understood as including both singular and plural font's. Additionally, for illustration, each component and region in the drawings may be drawn in an enlarged scale, but not an actual scale. The term "about" is used to describe the measured value including an acceptable error, depending partially on how the measurement is carried out by a person of ordinary skill in the art.

EXAMPLES

Preparation of a Solution of Photosensitive Resin Composition

A photosensitive resin composition 1 was prepared by mixing (a) a polymeric binder, such as 60 parts by weight of acrylic resin (100% solid) having a formulation of the following: 224 g methacrylic acid, 288 g methyl methacrylate, 104 g butyl acrylate, 120 g styrene, 64 g butyl methacrylate, and 8 g 2,2'-azobisobutyronitrile; (b) a photopolymerizable compound containing a double bond, such as 20 parts by weight of ethoxyl-modified trimethylolpropane triacrylate (PHOTOMER Cognis) and 15.6 parts by weight of aliphatic urethane oligomer; (c) a photoinitiator, such as 0.1 parts by weight of n-phenylglycine (NPG, Hampford) and 3.6 parts by weight of imidazole dimer (BCIM, Black Gold); and (d) a solvent such as 20 parts by weight of butanone, as shown in Table 1 below. The photosensitive resin composition may additionally include malachite green as a dye (e).

environment of 50° C. and 92% relative humidity (RH) for 24 hours. Whether the protective layer slip from the laminated structure when winding the laminated structure was

TABLE 1

| Component | Material | Proportion (parts by weight) |
| --- | --- | --- |
| (a) Polymeric binder | acrylic resin (100% solid) having a formulation of the following composition: 224 g methacrylic acid, 288 g methyl methacrylate, 104 g butyl acrylate, 120 g styrene, 64 g butyl methacrylate, and 8 g 2,2'-azobisobutyronitrile | 60 |
| (b) Photopolymerizable compound containing a double bond | 20 parts by weight of ethoxyl-modified trimethylolpropane triacrylate (PHOTOMER Cognis) and 15.6 parts by weight of aliphatic urethane oligomer | 35.6 |
| (c) Photoinitiator | 0.1 parts by weight of n-phenylglycine (NPG, Hampford) and 3.6 parts by weight of imidazole dimer (BCIM, Black Gold) | 3.7 |
| (d) Solvent | 20 parts by weight of butanone | 20 |
| (e) Dye | Malachite green | 0.01 |

Table 2 shows the properties of a protective layer using a commercial polyester film that is treated by surface pretreatment and has a low sheet resistance and the properties of a protective layer directly using a commercial polyester film or polyethylene film.

observed with naked eyes. The protective layer was manually peeled off from the laminated structure, and the surface properties of the photosensitive resin layer after the protective layer was peeled off were observed. The quality of the samples was evaluated, for example, in terms of the quantity

TABLE 2

| | | Example 1 | Comparative Example 1 | Comparative Example 2 | Comparative Example 3 |
| --- | --- | --- | --- | --- | --- |
| | Products | S100H16 | T100H16 | R310 | GF-102 |
| Properties of Protective layers | Film thickness (nm) | 16 | 16 | 16 | 28 |
| | Sheet resistance ($\Omega/\square$) | $6 \times 10^9 \sim 7 \times 10^{10}$ | $2 \times 10^{14} \sim 1 \times 10^{15}$ | $2 \times 10^{14} \sim 1 \times 10^{15}$ | $2 \times 10^{15} \sim 1 \times 10^{16}$ |
| | Surface roughness (Ra) (nm) | 15~25 | 15~25 | 5~10 | 50~100 |
| | Maximum roughness (Spv) (nm) | 1800~2200 | 1800~2200 | 50~100 | 2500~2600 |
| Proportion and components in a photosensitive resin composition | | Same as the photosensitive resin composition 1 as shown in Table 1 | Same as the photosensitive resin composition 1 as shown in Table 1 | Same as the photosensitive resin composition 1 as shown in Table 1 | Same as the photosensitive resin composition 1 as shown in Table 1 |

S100H16: PET film of Mitsubishi Chemical (which is treated by surface pretreatment and has a low sheet resistance)
T100H16: PET film of Mitsubishi Chemical (which is treated by surface pretreatment)
R310: PET film of Mitsubishi Chemical
GF-102: Tamapoly PE film A supporting layer was trimmed to a width of 40 cm and a length of 25 cm. A solution of the photosensitive resin composition 1 having a composition described in Table 1 was evenly applied on the supporting layer having a thickness of 16 μm. The supporting layer was dried by a hot air convection dryer at 80° C. to 100° C. for 2 to 10 mins. A 40 μm thick photosensitive resin layer was formed on the supporting layer, and a protective layer listed in Table 2 was adhered to the photosensitive resin by using a cold-pressing roller.

Evaluation of Surface Properties

The aforementioned sample was trimmed to a width of 30 cm and a length of 20 cm. The sample was left in an of the residual photosensitive resin composition on the protective layer, and the surface contamination on and the number of air holes in the photosensitive resin layer.

Slip/wrinkles: to observe with naked eyes whether the protective layer slips from the laminated structure when winding the laminated structure and whether wrinkles appeared on the surface of the photosensitive resin layer when peeling of the protective layer. Slip/wrinkles was graded as follows.

○: No slip and no wrinkles appeared on the surface of the photosensitive resin layer.
Δ: No slip and a few of wrinkles appeared on the surface of the photosensitive resin layer.
x: Slip and wrinkles appeared on the surface of the photosensitive resin layer.

Peeling property: to observe whether there was residual photosensitive resin composition on the protective layer after the protective layer was peeled off. The peeling property was graded as follows.

◯: No residual photosensitive resin composition on the protective layer.

Δ: Through the observation with naked eyes, residual photosensitive resin composition on the protective layer occupied 5% or less of the surface area of the protective layer.

x: Through the observation with naked eyes, residual photosensitive resin composition on the protective layer occupied more than 5% of the surface area of the protective layer.

Contamination: surface contamination on the photosensitive resin layer was observed by using an optical microscope with 100× magnification. Contamination was graded as follows.

◯: No contamination observed.

x: Contamination observed.

Number of air holes: the surface of the photosensitive resin layer was observed with an optical microscope with 100× magnification, and the number of air holes was counted. The number of air holes was graded as follows.

◯: The number of air holes less than 20/m².

Δ: The number of air holes between 20/m² and 300/m².

x: The number of air holes greater than 300/m².

The above results are shown in Table 3.

| | | Example 1 | Comparative Example 1 | Comparative Example 2 | Comparative Example 3 |
|---|---|---|---|---|---|
| | Product | S100H16 | T100H16 | R310 | GF-102 |
| Evaluation results | Peeling property | ◯ | Δ | X | Δ |
| | Contamination | ◯ | X | X | X |
| | Number of air holes | ◯ | ◯ | ◯ | X |
| | Slipping behavior | ◯ | ◯ | X | ◯ |

In view of the properties of the protective layers of the example and comparative examples shown in Table 2 and the evaluation results of surface properties shown in Table 3, the protective layer of Example 1 has a sheet resistance between fix $6 \times 10^9 \Omega/\square$ and $7 \times 10^{10} \Omega/\square$, and a maximum roughness between 1,800 nm and 2,200 nm. That is, the protective layer of Example 1 meets the following characteristics of the protective layer of the present disclosure: 1,500 nm≤maximum surface roughness≤2,500 nm, and $1 \times 10^8 \Omega/\square \leq$ sheet resistance $\leq 1 \times 10^{12} \Omega/\square$. The protective layer did not slip from the laminated structure when winding the laminated structure. When the protective layer of Example 1 was peeled off from the surface of the photosensitive resin layer, no wrinkles appeared on the surface of photosensitive resin layer. There was no observation of contamination or substantial air holes on the photosensitive resin layer or residual photosensitive resin composition on the protective layer. In comparison, although the protective layer of Comparative Example 1 has a maximum roughness within the same range as the protective layer of Example 1, namely, a maximum roughness of between 1,800 nm and 2,200 nm, the sheet resistance thereof is between $2 \times 10^{14} \Omega/\square$ and $1 \times 10^{15} \Omega/\square$, which fails to meet the requirements for the sheet resistance of the protective layer of the present disclosure, i.e., $1 \times 10^8 \Omega/\square \leq$ sheet resistance $\leq 1 \times 10^{12} \Omega/\square$. According to the evaluation results of the surface properties of the protective layer of Comparative Example 1, although the protective layer did not slip from the laminated structure when winding the laminated structure and no wrinkles appeared on the surface of photosensitive resin layer after peeling off the protective layer, residual photosensitive resin composition (occupying 5% surface area of the protective layer) was observed on the protective layer, contamination were observed on the photosensitive resin layer. On the other hand, the protective layer of Comparative Example 2 has a maximum roughness of between 50 nm and 100 nm, which is far lower than the maximum roughness of the protective layer of the present disclosure. The protective layer slipped from the laminated structure when winding the laminated structure and wrinkles appeared on the surface of the photosensitive resin layer after peeling off the protective layer. In addition, due to the protective layer having a sheet resistance between $2 \times 10^{14} \Omega/\square$ and $1 \times 10^{15} \Omega/\square$, residual photosensitive resin composition (occupying more than 5% surface area of the protective layer) was observed with naked eyes on the protective layer and significant contamination on the photosensitive resin layer was also observed. The protective layer of Comparative Example 3 has a maximum roughness between 2,500 nm and 2,600 nm, and therefore, when the photosensitive resin layer was laminated to the circuit board after the protective layer was peeled off, air easily entered the interface where the circuit board was laminated to the photosensitive resin layer and formed air holes.

Given the above, a protective layer that meets the conditions of 1,500 nm≤maximum surface roughness≤2,500 nm and $1 \times 10^8 \Omega/\square \leq$ sheet resistance $\leq 1 \times 10^{12} \Omega/\square$ has a low charging voltage during being peeled off, and therefore, it can be easily peeled off and electrostatic interaction upon being peeled off may be reduced. In addition, it can prevent from the slip of the protective layer relative to the laminated structure when winding the laminated structure; or reduce the contamination on the photosensitive resin layer, the residual photosensitive resin composition on the protective layer, or the generation of wrinkles or air holes on the surface of the photosensitive resin layer after peeling of the protective layer. Such excellent properties can reduce undesired effects, which come from the dry film process, appears when applying the laminated structure to a circuit board.

What is claimed is:

1. A laminated structure, comprising a supporting layer, a photosensitive resin layer and a protective layer, wherein the protective layer is a polyester film with surface characteristics that meet the following conditions:
   1,500 nm≤maximum surface roughness≤2,500 nm; and
   $1 \times 10^8 \Omega/Y \leq$ sheet resistance $\leq 1 \times 10^{12} \Omega/Y$.

2. The laminated structure according to claim 1, wherein the protective layer has a thickness between about 1 μm and about 100 μm.

3. The laminated structure according to claim 1, wherein the photosensitive resin layer comprises:
   (a) a polymeric binder;
   (b) a photopolymerizable compound containing a double bond; and
   (c) a photoinitiator.

4. The laminated structure according to claim 1, wherein the protective layer has a maximum surface roughness between about 1,700 nm and about 2,300 nm.

5. The laminated structure according to claim 1, wherein the protective layer has a maximum surface roughness of between about 2,000 nm and about 2,300 nm.

6. The laminated structure according to claim 1, wherein the protective layer has a sheet resistance between $1\times10^{9}\Omega/Y$ and $1\times10^{11}\Omega/Y$.

7. The laminated structure according to claim 1, wherein the protective layer is antistatic.

* * * * *

UNITED STATES PATENT AND TRADEMARK OFFICE
CERTIFICATE OF CORRECTION

PATENT NO. : 9,817,313 B2  
APPLICATION NO. : 15/086412  
DATED : November 14, 2017  
INVENTOR(S) : Shin Yi Li et al.

Page 1 of 1

It is certified that error appears in the above-identified patent and that said Letters Patent is hereby corrected as shown below:

In the Claims

At Column 8, Claim 1, Line number 55, "$1\times10^8\Omega/Y \leq$ sheet resistance $\leq 1\times10^{12}\Omega/Y$." should read --$1\times10^8\Omega/\square \leq$ sheet resistance $\leq 1\times10^{12}\Omega/\square$.--

At Column 9, Claim 6, Line number 5, "The laminated structure according to claim 1, wherein the protective layer has a sheet resistance between $1\times109\Omega/Y$ and $1\times1011\Omega/Y$." should read --The laminated structure according to claim 1, wherein the protective layer has a sheet resistance between $1\times109\Omega/\square$ and $1\times1011\Omega/\square$.--

Signed and Sealed this  
Seventh Day of August, 2018

Andrei Iancu  
*Director of the United States Patent and Trademark Office*